United States Patent [19]

Honda

[11] Patent Number: 4,490,640

[45] Date of Patent: Dec. 25, 1984

[54] MULTI-FREQUENCY ULTRASONIC TRANSDUCER

[76] Inventor: Keisuke Honda, 62-1 Aza Shinsanbongi, Shinsanbongi-cho, Toyohashi-shi, Aichi-ken, Japan

[21] Appl. No.: 534,543

[22] Filed: Sep. 22, 1983

[51] Int. Cl.$^3$ .............................................. H01L 41/08

[52] U.S. Cl. .................................... 310/325; 310/322; 367/157

[58] Field of Search ............... 310/322, 323, 325, 334; 367/153, 155, 157

[56] References Cited

U.S. PATENT DOCUMENTS

| | | | |
|---|---|---|---|
| 2,921,134 | 1/1960 | Greenspan et al. | 310/334 X |
| 3,292,018 | 12/1966 | Clynes | 310/334 |
| 3,689,783 | 9/1972 | Williams | 310/325 |
| 3,872,330 | 1/1975 | Miller et al. | 310/334 X |
| 3,922,572 | 11/1975 | Cook et al. | 310/334 |

*Primary Examiner*—Mark O. Budd
*Attorney, Agent, or Firm*—Burgess, Ryan and Wayne

[57] ABSTRACT

An ultrasonic transducer consisting of three piezoelectric element couples sandwiched between four metal terminals. Each piezoelectric couple has two piezoelectric elements separated by an electrode. The piezoelectric couples and the metal terminals are secured together by a bolt. The transducer exhibits various combinations of resonant frequencies in its impedance-frequency characteristic as determined between various combinations of the electrodes and terminals.

6 Claims, 8 Drawing Figures

Fig. 7
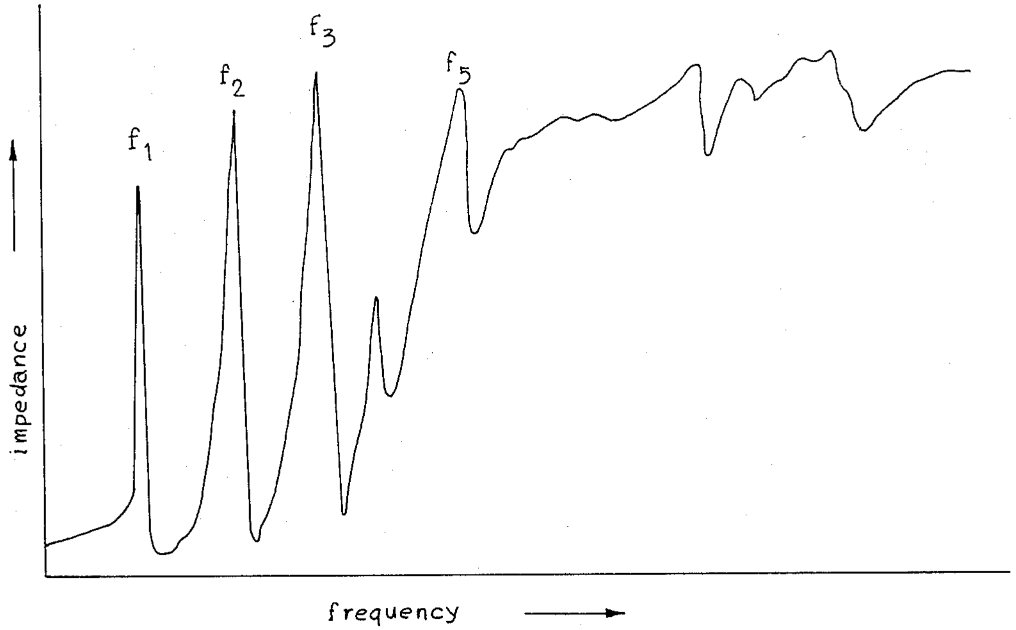
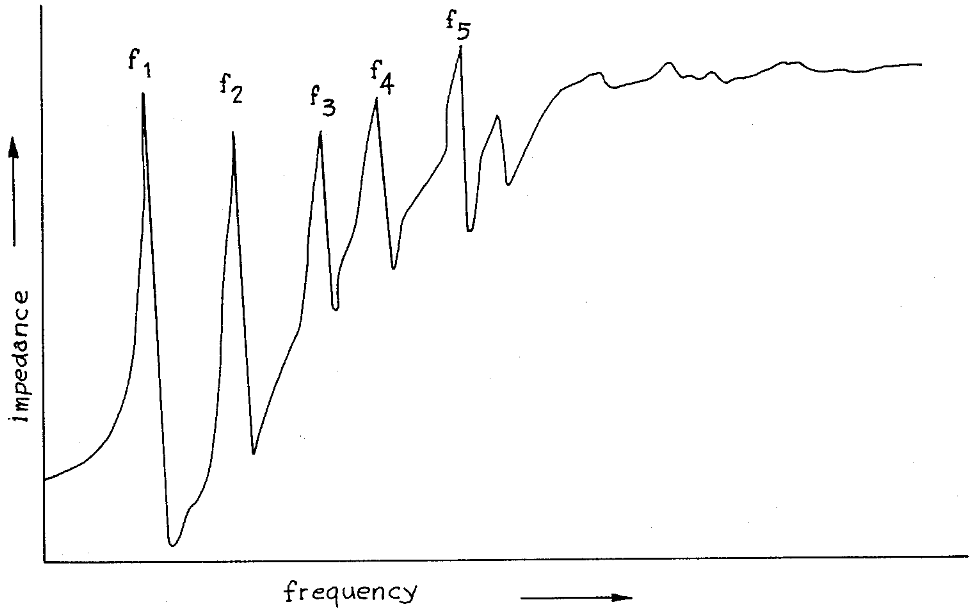
Fig. 8

MULTI-FREQUENCY ULTRASONIC TRANSDUCER

BACKGROUND OF THE INVENTION

The present invention relates to a multi-frequency ultrasonic transmitting and receiving equipment having three couples of piezoelectric elements and metal terminals.

In recent years, almost all fishing boats are provided with fish sonars. The fish sonars use various frequencies owing to detecting fishes. When multiple fish boats having the fish sonars of the same frequency are massed in a fishing ground, the fish sonars cannot be executed an original performance owing to crosstalk. Therefore, a fish sonar using multi-frequencies is required.

For solving these problems, fish sonar systems are used which are provided with a plurality of transmitting and receiving equipments operated by various frequencies or transmitting and receiving equipments having a plurality of piezoelectric vibrators operated by various frequencies. Therefore, since the transmitting and receiving equipments become large, these fish sonar systems are unsuitable for a small fishing boat and are expensive.

Also, the other known fish sonar comprises a transmitting and receiving equipment in which the resonance frequencies in the thickness-directional vibration and the diameter-directional vibration of a disk-type piezoelectric vibrator or the thickness-directional vibration, the short side-directional vibration and the long side-directional vibration of a rectangle type piezoelectric vibrator are used. In this fish sonar, however, the length of the diameter of the disk-type piezoelectric vibrator or the length of the one side of the rectangle-type piezoelectric vibrator is limited for input electric power and the directional characteristic of the piezoelectric vibrator. Therefore, in this fish sonar, two or three frequencies separated by long intervals are used.

SUMMARY OF THE INVENTION

It is, therefore, an object of the present invention to provide a multi-frequency ultrasonic transmitting and receiving equipment in which ultrasonic vibrations of a plurality of frequencies are transmitted and received by changing driving points in one vibrator.

It is another object of the present invention to provide a multi-frequency ultrasonic transmitting and receiving equipment by which fish sonars having no crosstalk can be composed.

The multi-frequency ultrasonic transmitting and receiving equipment according to the present invention comprises three pairs of piezoelectric elements having terminals respectively arranged between the contact faces of respective couples of the piezoelectric element, and metal terminals fixed at both ends of the respective couples of the piezoelectric elements, the three couples of piezoelectric elements being respectively arranged at positions of about 0.125, 0.25 and 0.5 in total length from one end of the metal terminals; and three couples of piezoelectric elements and the metal end terminals being fixed by a bolt as one body.

BRIEF DESCRIPTION OF THE DRAWINGS

FIGS. 2-8 are views for explaining the operation of the multi-frequency ultrasonic transmitting and receiving equipment in FIG. 1.

DESCRIPTION OF THE PREFERRED EMBODIMENTS

Figure 1:
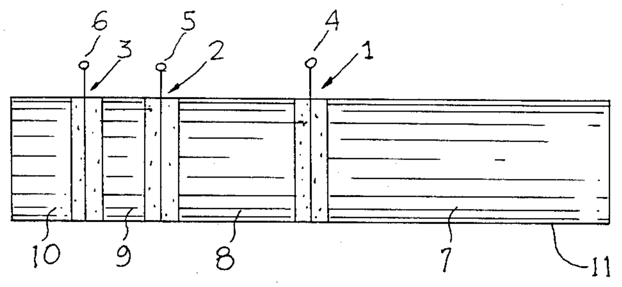
FIG. 1 is a side view of a multi-frequency ultrasonic transmitting and receiving equipment according to a preferred embodiment of the present invention.

FIG. 1 shows a side view of multi-frequency ultrasonic transmitting and receiving equipment. In FIG. 1, the three couples of piezoelectric elements 1, 2 and 3 respectively have electrodes 4, 5 and 6 between contact faces thereof, and metal terminals 7, 8, 9 and 10 are connected to corresponding ends of the respective couples of piezoelectric elements 1-3. The piezoelectric elements 1-3 and the metal terminals 7-10 are screwed together by one bolt (not shown) passed through the centers thereof, and consequently a multi-frequency ultrasonic transducer 11 is constructed. The bolt electrically interconnects the terminals 7, 8, 9 and 10.

The respective piezoelectric elements 1-3 are oriented so as to have polarizations in the same directions as each other; and are arranged at positions of 0.125, 0.25 and 0.5 of the total length from one end of the metal terminal 10.

In one embodiment of the present invention, the three couples of piezoelectric elements 1-3 consist of PZT piezoelectric elements, the thickness of which is 5 mm, and are respectively arranged at positions of 72 mm, 36 mm and 18 mm from the one end of the metal terminal 10; and the metal terminals 7-10 consisting of aluminum are so arranged at both ends of the respective couples of piezoelectric elements that the total length becomes 144 mm. The diameter of the transducer 11 is 25 mm.

Figure 2:
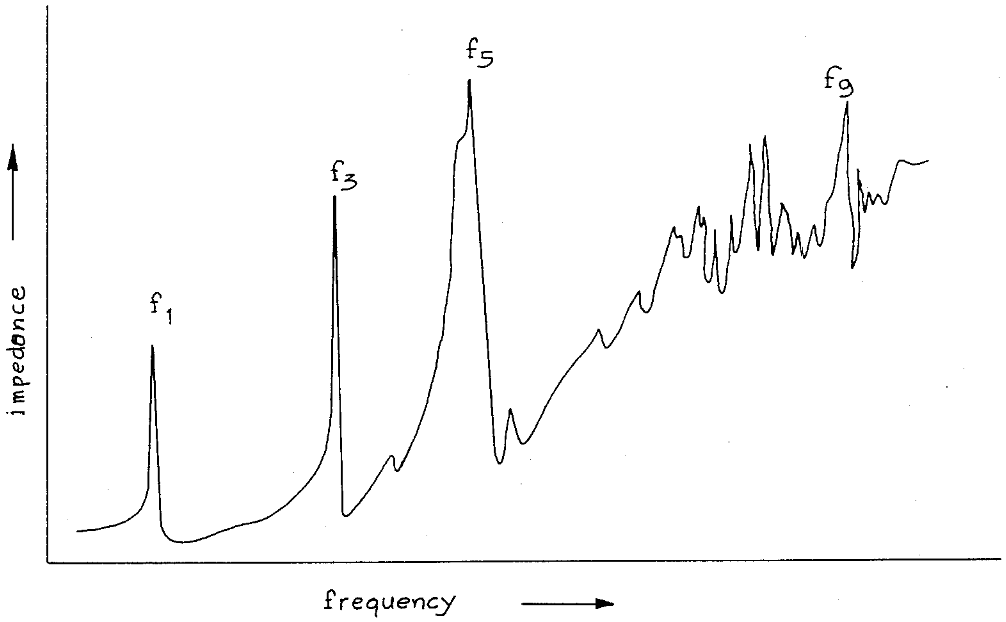

In the multi-frequency ultrasonic transmitting and receiving equipment according to the above embodiment, when a variable frequency power source is connected between the electrode 4 and the metal terminals 7-10, and one couple comprising piezoelectric element couple 1 is driven, large resonances are detected at frequencies $f_1$, $f_3$, $f_5$ and $f_9$ as shown in FIG. 2; and the resonance frequencies and the resonance impedances are detected in $f_1$ (14.43 KHz, 740Ω), $f_3$ (45.44 KHz, 340Ω), $f_5$ (70.46 KHz, 170Ω) and $f_9$ (195.9 KHz, 50Ω) as shown for the driving terminal 4 of the Table 1.

TABLE 1

| driving terminal | | frequency | | | | | | | | |
|---|---|---|---|---|---|---|---|---|---|---|
| | | $f_1$ | $f_2$ | $f_3$ | $f_4$ | $f_5$ | $f_6$ | $f_7$ | $f_8$ | $f_9$ |
| 4 | $f_r$(KHz) | 14.43 | | 45.44 | | 70.46 | | | | 195.9 |
| | R (Ω) | 740 | | 340 | | 170 | | | | 50 |
| 5 | $f_r$(KHz) | 14.60 | 29.55 | 45.68 | | 71.49 | 86.72 | | | |
| | R (Ω) | 1070 | 620 | 550 | | 360 | 85 | | | |
| 6 | $f_r$(KHz) | | 29.75 | 44.69 | 55.72 | 71.48 | | | 129.34 | |
| | R (Ω) | | 900 | 210 | 450 | 350 | | | 155 | |
| 4-5 | $f_r$(KHz) | 14.22 | 29.30 | | | 72.85 | | 94.55 | | |
| | R (Ω) | 240 | 750 | | | 110 | | 40 | | |
| 4-6 | $f_r$(KHz) | 14.40 | | | 55.29 | 69.96 | 86.62 | | | |
| | R (Ω) | 410 | | | 150 | 126 | 58 | | | |
| 5-6 | $f_r$(KHz) | 14.54 | 29.15 | 44.29 | | 70.46 | | | | |

TABLE 1-continued

| driving terminal | | frequency | | | | | | | | |
|---|---|---|---|---|---|---|---|---|---|---|
| | | $f_1$ | $f_2$ | $f_3$ | $f_4$ | $f_5$ | $f_6$ | $f_7$ | $f_8$ | $f_9$ |
| | R (Ω) | 540 | 197 | 117 | | 170 | | | | |
| 4-5-6 | $f_r$(KHz) | 14.18 | 29.14 | 43.46 | 55.07 | 72.20 | | | | |
| | R (Ω) | 198 | 260 | 340 | 215 | 175 | | | | |

Figure 3:
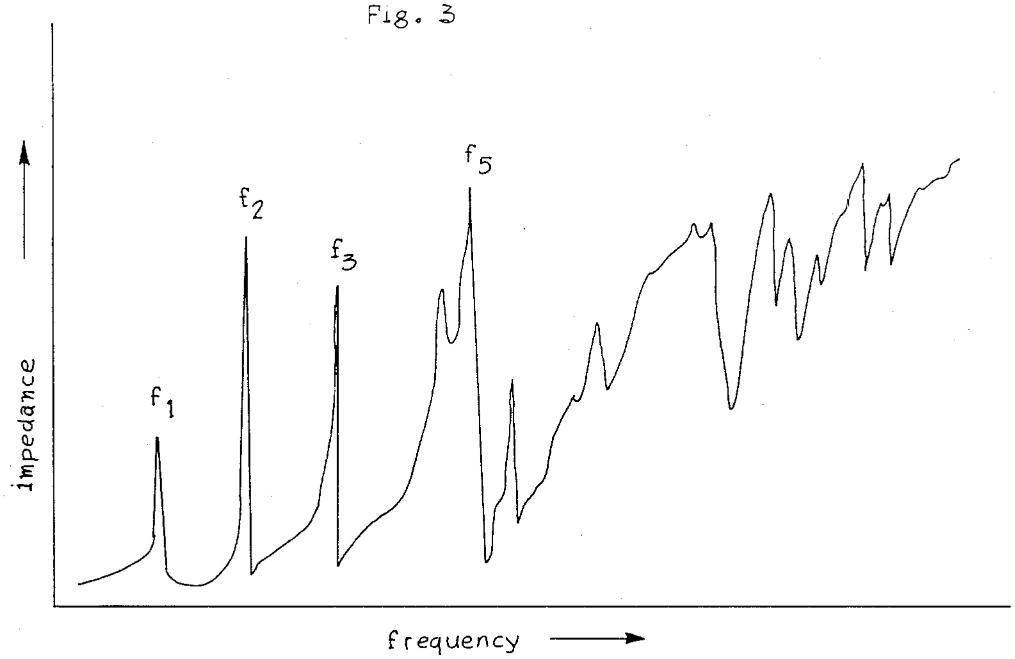
Figure 4:
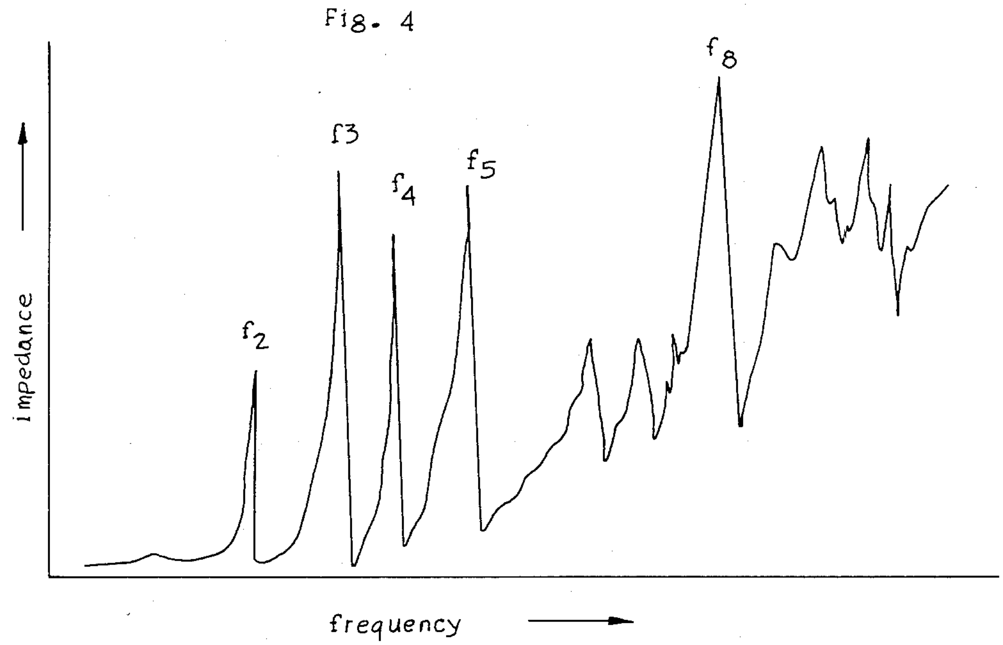

Also, when one couple comprising piezoelectric elements 2 is driven by connecting the electrode 5 to one terminal of the variable frequency power source and the metal terminals 7, 8, 9 and 10 to the other terminal of the variable frequency power source, large resonances are detected at frequencies $f_1$, $f_2$, $f_3$, $f_5$ and $f_6$ as shown in FIG. 3; and the resonance frequencies and the resonance impedances are detected at the driving electrode 5 as shown in Table 1.

Next, when the couple comprising piezoelectric elements 3 is driven by connecting the electrode 6 to one terminal of the variable frequency power source and comprising the metal terminals 7, 8, 9 and 10 to the other terminal of the variable frequency power source, large resonances are detected at frequencies $f_2$, $f_3$, $f_4$, $f_5$ and $f_8$ and the resonance frequencies and the resonance impedances are detected at the driving electrode 6 as shown in Table 1.

Figure 5:
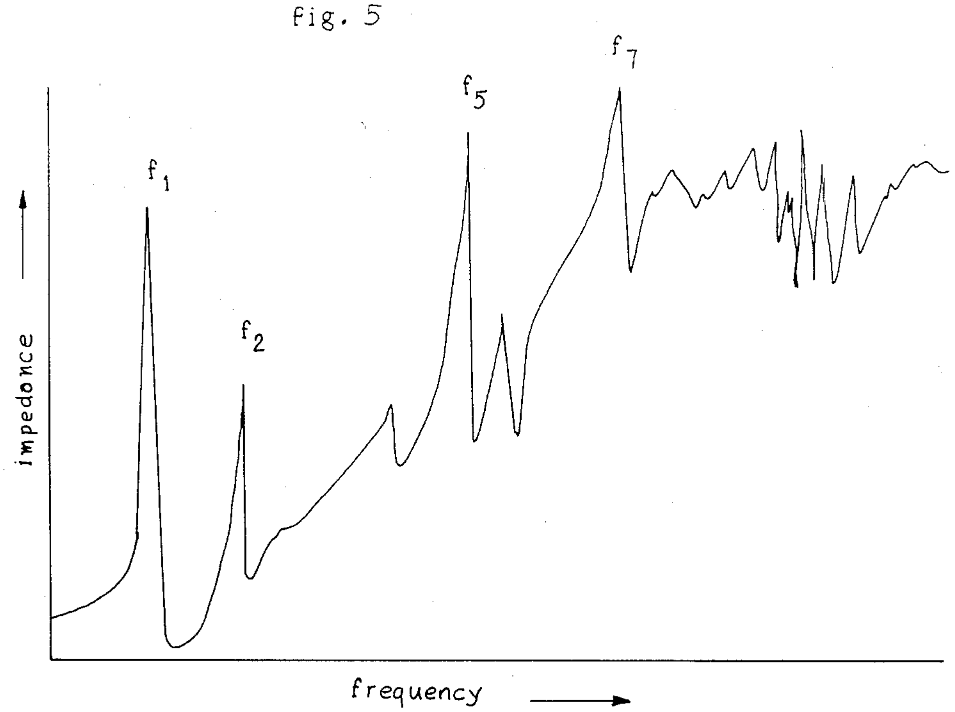
Figure 6:
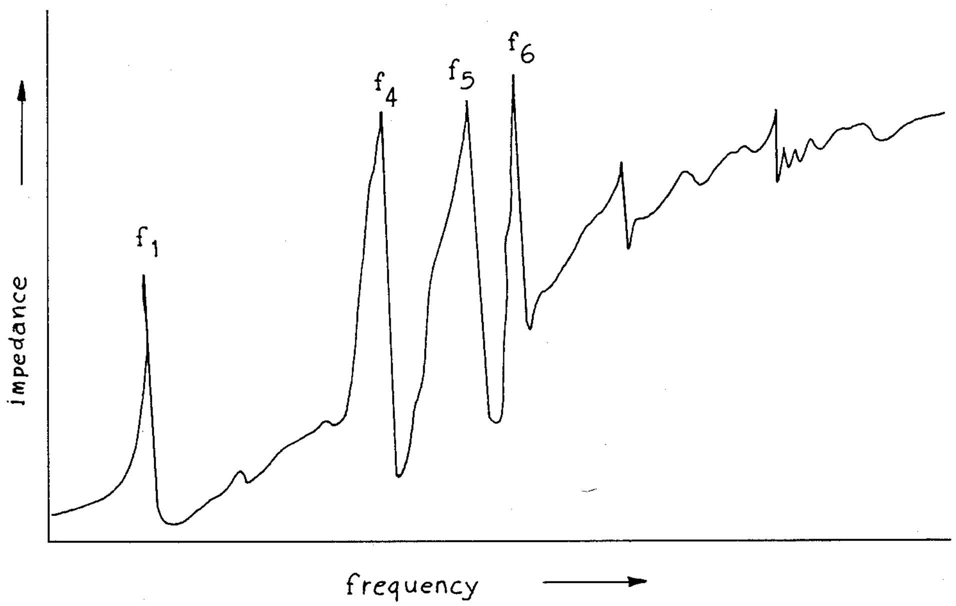

Also, when the electrodes 4 and 5 are simultaneously connected to one terminal of the variable frequency power source, and the metal terminals 7, 8, 9 and 10 are connected to the other terminal of the variable frequency power source, then two couples comprising the piezoelectric elements 1 and 2 are driven; large resonances are detected at the frequencies $f_1$, $f_2$, $f_5$ and $f_7$ as shown in FIG. 5; and the resonance frequencies and the resonance impedances are detected at the driving electrodes 4 and 5 as shown in Table 1.

When the electrodes 4 and 6 are simultaneously connected to one terminal of the variable frequency power source and the metal terminals 7, 8, 9 and 10 are connected to the other terminal of the variable frequency power source, then two couples comprising piezoelectric elements 1 and 3 are driven; large resonances are detected at the frequencies $f_1$, $f_4$, $f_5$ and $f_6$ as shown in FIG. 7; and the resonance frequencies and the resonance impedances are detected at the driving electrodes 5-6 as shown in Table 1.

When the electrodes 4, 5 and 6 are simultaneously connected to one terminal of the variable frequency power source, and the metal terminals 7, 8, 9 and 10 are connected to the other terminal of the variable frequency power source, then three couples comprising piezoelectric elements 1, 2 and 3 are driven; large resonances are detected at the frequencies $f_1$, $f_2$, $f_3$, $f_4$ and $f_5$ as shown in FIG. 8; and the resonance frequencies and the resonance impedances are detected at the driving electrodes 4-5-6 as shown in Table 1.

As clearly shown in the above measured data, in the bolted piezoelectric vibrator according to the present invention, nine specific resonance frequencies can be detected in the impedance frequency characteristic thereof; and odd harmonic frequencies or even harmonic frequencies of the fundamental frequency can be provided by variously changing the electrical connections of the electrodes of the piezoelectric elements to change the number and position of the driven piezoelectric elements.

For using the bolted piezoelectric vibrator according to the present invention as a submersible ultrasonic transmitting and receiving equipment, the bolted piezoelectric vibrators which respectively consist of the three couples of the piezoelectric elements as shown in FIG. 1 are arranged in a rubber housing. When the sensitivity of this transmitting and receiving equipment comprising the bolted piezoelectric vibrators is measured in the water by driving the respective couples of piezoelectric elements as shown in Table 2, very sensitive transmitting and receiving operation is obtained at the respective frequencies indicated in Table 2.

TABLE 2

| No. | driving terminal | resonance frequency KHz | transmitting voltage dB sensitivity | receiving voltage dB sensitivity |
|---|---|---|---|---|
| 1 | 4-5 | 14.7 | 57.4 | −65.6 |
| 2 | 5-6 | 29.8 | 58.6 | −62.5 |
| 3 | 5-6 | 44.5 | 65.9 | −63.4 |
| 4 | 4-6 | 55.4 | 67.4 | −60.9 |
| 5 | 4-5 | 73.0 | 67.2 | −58.3 |
| 6 | 4-6 | 87.0 | 67.7 | −56.8 |
| 7 | 4-5 | 95.0 | 68.3 | −57.9 |
| 8 | 6 | 129.6 | 67.4 | −55.5 |
| 9 | 4 | 198.0 | 65.6 | −47.5 |

As explained in the above, transmitting and receiving equipment according to the present invention, three couples of piezoelectric elements are arranged at positions of 0.125, 0.25 and 0.5 distance from one end of the bolted piezoelectric vibrator body; electrodes are provided between the contact faces of the respective couples of piezoelectric elements; and metal terminals consisting of electrically interconnected metal bars are of fixed to respective ends of the three couples of piezoelectric elements. The transmitting and receiving equipment consisting of the three couples of piezoelectric elements and the metal bars are bolted as one body. Ultrasonic vibrations of various frequencies are generated by the transmitting and receiving transducer by connecting one, two or three electrodes of the piezoelectric elements to one terminal of a variable frequency power source; and a highly sensitive transmitting and receiving transducer can thereby be obtained at a plurality of resonant frequencies.

What is claimed is:

1. A multi-frequency ultrasonic transducer comprising three couples of piezoelectric elements having respective terminals between contact faces thereof, and metal terminals being provided in respective both ends of said three couples of piezoelectric elements, said three couples of piezoelectric elements respectively arranged at the positions of about 0.125, 0.25 and 0.5 from one end in total length thereof, said three couples of piezoelectric elements and said metal terminals being fixed by a bolt which is passed through the center thereof.

2. A multi-frequency ultrasonic transducer according to claim 1, wherein one of said three couples of piezoelectric elements is driven by a variable frequency power source.

3. A multi-frequency ultrasonic transducer according to claim 1, wherein two couples of said three couples of piezoelectric elements are driven by a variable frequency power source.

4. A multi-frequency ultrasonic transducer according to claim 1, wherein said three couples of piezoelectric elements are driven by a variable frequency power source.

5. A multi-frequency ultrasonic transducer, comprising:

a first piezoelectric couple comprising two piezoelectric elements each having substantially parallel inner and outer major surfaces, and a first electrode disposed between and in electrical contact with the inner major surfaces of both piezoelectric elements of said first couple;

a first metal terminal having an end face and another face opposite said end face, said other face being contiguous with one outer major surface of said first piezoelectric couple;

a second metal terminal having opposite faces, one of said faces being contiguous with the other outer major surface of said first piezoelectric couple;

a second piezoelectric couple comprising two piezoelectric elements each having substantially parallel inner and outer major surfaces, and a second electrode disposed between and in electrical contact with the inner major surfaces of both piezoelectric elements of said second couple, one of said outer major surfaces being contiguous with the other face of said second metal terminal;

a third metal terminal having opposite faces, one of said faces being contiguous with the other outer major surface of said second piezoelectric couple;

a third piezoelectric couple comprising two piezoelectric elements each having substantially parallel inner and outer major surfaces, and a third electrode disposed between and in electrical contact with the inner major surfaces of both piezoelectric elements of said third couple, one of said outer major surfaces being contiguous with the other face of said third metal terminal; and a fourth metal terminal having an end face and another face opposite said end face, said other face being contiguous with the other outer major surface of said third piezoelectric couple, said piezoelectric couples and said metal terminals being secured together, whereby the electrical impedance of said transducer exhibits various resonant frequencies between various combinations of said electrodes and metal terminals.

6. The transducer according to claim 5, wherein the distance between said third electrode and the end face of said first terminal is substantially equal to one-half the distance between the end faces of said first and fourth terminals, the distance between said second electrode and the end face of said first terminal is substantially equal to one-quarter the distance between the end faces of said first and fourth terminals, and the distance between said first electrode and the end face of said first terminal is substantially equal to one-eighth the distance between the end faces of said first and fourth terminals.

* * * * *